US006847310B1

United States Patent
Gill et al.

(10) Patent No.: US 6,847,310 B1
(45) Date of Patent: Jan. 25, 2005

(54) KEYBOARD

(75) Inventors: Christopher Francis Gill, Seattle, WA (US); Joseph W. Yang, Castro Valley, CA (US)

(73) Assignee: BSquare Corporation, Bellevue, WA (US)

( * ) Notice: Subject to any disclaimer, the term of this patent is extended or adjusted under 35 U.S.C. 154(b) by 0 days.

(21) Appl. No.: 10/177,255

(22) Filed: Jun. 21, 2002

(51) Int. Cl.$^7$ ................ H03K 17/94; H03M 11/00
(52) U.S. Cl. .................. 341/22; 379/93.27; 455/575
(58) Field of Search .................. 341/22; 345/169; 379/93.27; 455/90, 575

(56) References Cited

U.S. PATENT DOCUMENTS

| | | | | |
|---|---|---|---|---|
| 2,641,320 A | * | 6/1953 | Johnson ................ | 234/123 |
| 4,799,254 A | | 1/1989 | Dayton et al. ........ | 379/97 |
| 5,249,220 A | | 9/1993 | Moskowitz et al. ... | 379/93 |
| 6,043,760 A | * | 3/2000 | Laakkonen ............ | 341/22 |
| 6,049,796 A | | 4/2000 | Siitonen et al. ....... | 707/3 |
| 2002/0061218 A1 | * | 5/2002 | Hsii ..................... | 400/489 |
| 2002/0063690 A1 | * | 5/2002 | Chung et al. ......... | 345/168 |
| 2003/0073414 A1 | * | 4/2003 | Capps .................. | 455/90 |

FOREIGN PATENT DOCUMENTS

WO    WO 01/85460    * 5/2001

OTHER PUBLICATIONS

Compact Computer Keyboard, IBM Technical Disclosure Bulletin, Mar. 1985, vol. No. 27.*
Copeland, Libby, Thumbs up for the Age of the Thumb, The Washington Post; 9 pages.
Krakow, Gary, Faster, Wireless Pocket PCs, MSNBC; 7 pages.
Berlund, David, What to Look for in your next PDA/Phone, Tech Update, Jul. 9, 2002; 4 pages.
Broom, Tracie, RIM 950 Wireless Handheld, CNET, Mar. 7, 2000; 2 pages.

* cited by examiner

Primary Examiner—Timothy Edwards
(74) Attorney, Agent, or Firm—LaRiviere, Grubman & Payne, LLP

(57) ABSTRACT

A keyboard (1) for use on an electronic device allowing input of both alphabetic and numerical information adapted for use with a minimal number of keys (2–73) and space. The keyboard includes numerical keys (39–41, 51–53, 63–65) arranged in the format used in telephones and a qwerty arrangement of alphabetic keys (32–42, 44–54, 56–65). Multiple function keys (67–69, 71) allow use to create all functions of a computer keyboard for use in a small device.

6 Claims, 1 Drawing Sheet

KEYBOARD

TECHNICAL FIELD

This invention relates to input devices for electrical devices. In particular, the invention relates to keyboards for use with multi-function devices. With still greater particularity, the invention relates to limited key keyboards for miniature devices.

BACKGROUND ART

Keyboards are used in a wide variety of electrical devices. Many arrays of keys have been developed for use, but the standard QWERTY remains the most popular. Keyboards are used in calculators, phones and several other devices. Miniature devices such as Personal Digital Assistants (PDS) generally use touch screens with a handwriting recognition program, but a few devices use a thumb keyboard for rapid entry of alphanumeric material. A typical device of this type is the Blackberry®manufactured by Research in Motion Limited. To type the numeral one (1) on a Blackberry®, for example, you must first push the Alt key then the Q key. To enter strings of numbers such as telephone numbers, this entry method is quite cumbersome.

A suitable keyboard is an essential element of a new generation of electronic devices which will combine the functions of a personal computer, cell phone, web browser, PDA and calculator. Such devices will have full wireless internet capability and a high resolution display. Add-ons could include global positioning system receivers and imaging equipment. These devices will need a keyboard able to support such functions without being unduly cumbersome. A keyboard for such devices should be able to access all Windows® functions as well as allow easy entry of long streams of numerals and cell phone functions.

DISCLOSURE OF THE INVENTION

A problem has arisen in keyboard technology where a relatively small keyboard is needed in order to have a small device that accesses many functions. This problem has led to the development of so-called thumb keyboards specializing in e-mail devices where text can be rapidly produced by use of two thumbs for typing. To-date such keyboards are limited to easy production of text. Long numbers are still tedious to type with thumb key boards with many errors. Accordingly, there is a demand for a keyboard which allows rapid production of both text and numbers.

Because of the limited number of keys on a thumb keyboard, the invention makes extensive use of the Shift key and the two Function keys. When the user simply presses a key, the invention generates the lower case character. When the user presses a Shift key followed by another key, the invention generates the upper case letter. When the user presses the first function key followed by another key, the invention generates the character shown in a color corresponding to the first function key. When the user presses the second function key followed by another key, the invention generates the character shown on the chosen key in the color of the second function key.

A portion of the keyboard functions as a telephone keypad. These keys are activated by using a Num Lock key. Keys affected by Num Lock have a colored highlight in the upper right of the key cap. Caps Lock and Num Lock cannot both be set at the same time. When the Num Lock is activated the device functions as a call phone. Additional keys include browser and e-mail activation keys and a joypad with dual triggers for game operation and cursor control. Volume controls and power controls complete the device.

The invention's QWERTY thumb keyboard supports a full compliment of standard Windows keyboard navigation shortcuts including Alt, Ctrl, Del, Tab, Page Down, Home, Page Up, End, and Insert. For convenience with a thumb keyboard, these shortcuts and accelerators use sequential key presses rather than simultaneous. The keyboard is capable of operating in international modes to produce a full set of international characters.

The invention provides a suitable input device for allowing the entry of telephone numbers for direct dialing including Talk and End functions. The numerical operation of the invention is also suitable for operation of programs such as web browsers, spreadsheets and databases, both quickly and efficiently.

BEST MODE FOR CARRYING OUT THE INVENTION

Figure 1:
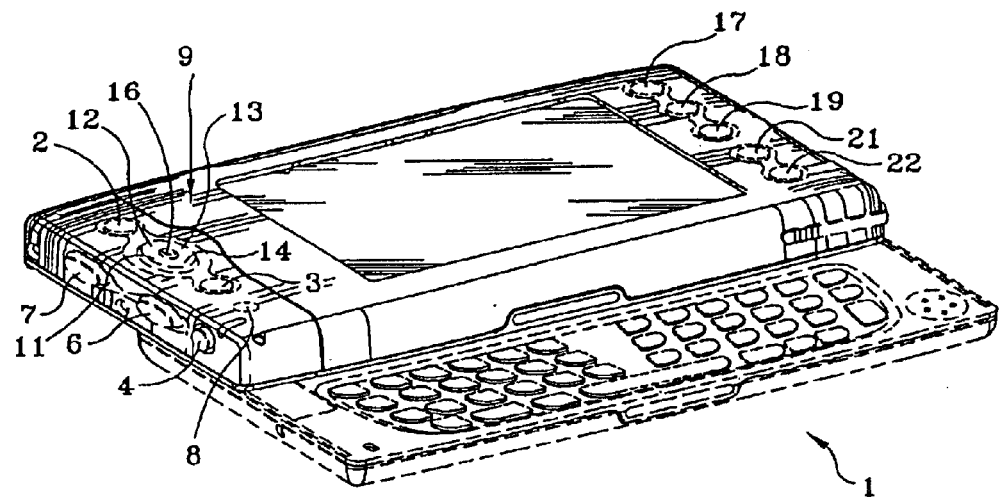
FIG. 1 is a top plan view of a device incorporating the keyboard of the invention.

FIG. 1 is a top plan view of a device incorporating the keyboard of the invention. The device is shown with a slide-out keyboard 1, but an embodiment where all buttons are on a single plane is within the concept of the invention. This device incorporates a number of additional controls to those of keyboard 1. The controls include a left trigger 2 for game use on the device top which is also a duplicate of Tab key. A similar right trigger 3 on device top which is a duplicate of a Space Bar. A power button 4 is located on side of the device as are the VOLUME UP 6 and VOLUME DN 7 controls. On the top of the device are located a ZOOM control 8 and a Joypad 9 which further includes a LEFT ARROW 11, a UP ARROW 12, a RIGHT ARROW 13, a DOWN ARROW 14, and a Just Joypad click 16 which is also a duplicate of the Enter key. The top of the device further includes controls for BACK 17 which duplicates Esc, HOME/Today 18, BROWSER 19, EMAIL 21, TALK/END 22.

Figure 2:
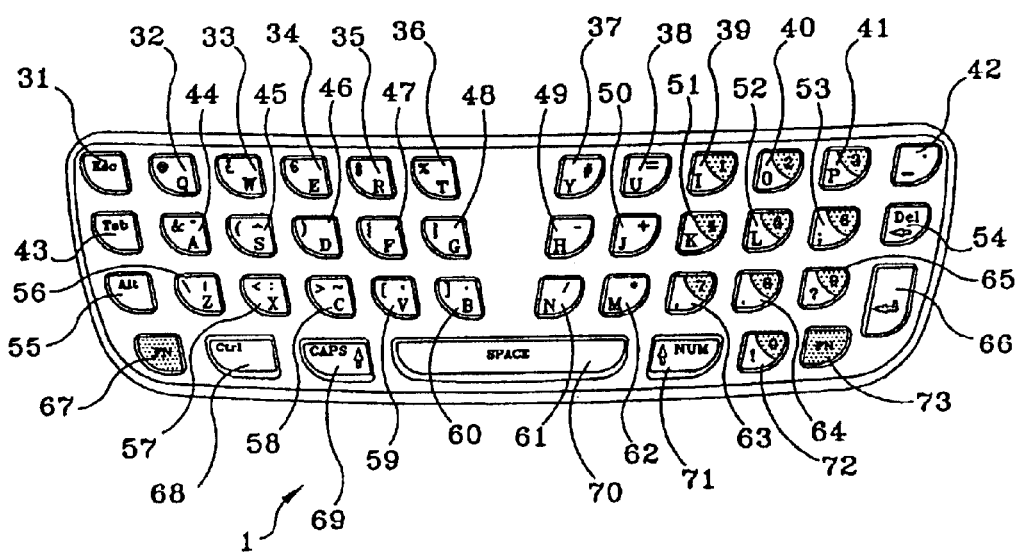
FIG. 2 is a top plan view of the keyboard of the invention.

FIG. 2 is a top plan view of keyboard 1 of the invention. Keys 32–42, 44–54 and 56–65 are arranged in a qwerty arrangement to provide an alphabetic keyboard. A shift key 69 provides access to upper case letters and symbols, the return key 66 and a space bar 70 located in the traditional location inserts a blank between characters. Numbers are provided by pressing keys 39–41, 51–53, 63–65 and 72 arranged in a pattern identical to a standard telephone keyboard. A Num Lock key 71 aids in accessing the numbers. An Escape key 31, a Tab Key 43, a Alt key 55, a Ctrl key 68, a Del/backspace key 54 and minus (−) key 42 provide standard computer functions. Alternative key assignments are accessed through the Blue Fun key 67 and Orange Fun key 73.

The invention makes extensive use of Shift key 69 and the two Fun keys 67 and 73. When the user simply presses one of alphabetic keys 32–42, 44–54 or 56–65, the invention generates the lower case character, e.g., key 60 (B) generates (b) represented by the hexadecimal character code value returned by the Windows WM_CHAR message code[42]. When the user presses Shift key 69 or 71, which are either of the up arrow keys (↑) 69 or 70 next to Space bar (70) followed by another key, the invention generates the upper case letter, e.g., key (60) B generates (B). When the user presses blue Fun 67 followed by another key, the invention generates the character shown in blue on the key cap, e.g., key 60 (B) generates (]) represented by the hexadecimal character code value returned by the Windows WM_CHAR message[DD]. When the user presses orange Fun 73 followed by another key, the invention generates the character shown in orange on the key cap, e.g., key 60 (B) generates (') represented by the hexadecimal character code value returned by the Windows WM_CHAR message[DE].

The sequence orange Fun key 73 followed by Shift key 69 sets the keyboard into a "Caps Lock" state, where all subsequent alphabetic key presses 32–42, 44–54 or 56–65 are interpreted as if they were preceded by Shift key 69 or 71. Pressing orange Fun key 73 followed by Shift key 69 again clears the Caps Lock state. Similarly, blue Fun key 67 and Num key 71 sets the keyboard into a "Num Lock" state. Pressing blue Fun key 67 and Num key 71 again clears the Num Lock state. Keys affected by Num Lock 39–41, 51–53, 63–65 and 72 have the blue highlight in the upper right of the key cap. Caps Lock and Num Lock cannot both be set at the same time.

FIG. 3 is a chart of key combinations used to produce international and extended characters. Although they are not shown on the keycaps, the invention supports the entry of international characters. To change these settings, the user can access the Regional Settings icon in the Control Panel. The International keyboard layout does not remap the standard US keyboard layout; instead, it creates international characters by assigning certain characters a strikeover function so that the user can add an accent or diacritical mark to a character. It also assigns new functions to orange Fun key 73.

When the user generates an APOSTROPHE ('), QUOTATION MARK ("), ACCENT GRAVE (`), TILDE (˜), ACCENT CIRCUMFLEX, or CARET (ˆ), nothing appears on the screen until the user generates the second key code. If the user presses one of the letters designated as eligible to receive an accent mark, the accented version of the letter appears. If the user presses an ineligible key, two separate characters appear. The invention automatically accents letters that customarily receive an accent but does not automatically accent letters that do not customarily receive an accent.

The user can press the orange Fun key 73 and then another character to produce some common extended characters. Most keys on the keyboard produce one or two extended characters in combination with the orange Fun key 73. Table 1 is an incomplete list of some of these extended characters:

TABLE 1

| Key Combination | Result |
| --- | --- |
| orange Fun 73 + 35 (R) | Registered trademark symbol ® |
| orange Fun 73 + 59 (Y) | Copyright symbol © |
| orange Fun 73 + 33 (W) | ae symbol æ |

With the International keyboard, if the user wants to type one of these characters (an APOSTROPHE, QUOTATION MARK, CARET, TILDE, or ACCENT GRAVE) followed by an unaccented letter, the user presses the SPACE BAR after the user presses the key. For example, to type "A girl named Sally," the user presses orange Fun key 73, then A key 44 (for "), then presses SPACE 70, then presses a Shift key 69 or 71, then presses A 44.

Table 2 lists the accented characters created by the US-International keyboard:

TABLE 2

| User Presses This | Then This Key | Result |
| --- | --- | --- |
| orange Fun 73 + 60 (B ') | 58 (C) | ç, Cedilla |
| orange Fun 73 + 60 (B ') | 34,37,38,39,40,44 | \<letter\>, Accent acute |
| orange Fun 73 + 60 (B ') | 70 (SPACE) | Apostrophe (') |
| orange Fun 73 + 60 (B ') | All others | Apostrophe followed by the letter (two separate characters) |
| orange Fun 73 + 60 (B ') | n/a | Accent acute |
| orange Fun 73 + 44 (A ') | 34,37,38,39,40,44 | \<letter\>, Dieresis |
| orange Fun 73 + 44 (A ') | 70(SPACE) | Quotation mark (") |
| orange Fun 73 + 44 (A ') | All others | Quotation mark followed by the letter (two separate characters) |
| orange Fun 73 + 55 Alt + 44 (A ') | n/a | Dieresis |
| orange Fun 73 + 59(V `) | 34,38,39,40 | \<letter\>, Accent grave |
| orange Fun 73 + 59(V `) | 70(SPACE) | Accent grave (`) |
| orange Fun 73 + 59(V `) | All others | Accent grave followed by the letter (two separate characters) |
| orange Fun 73 + 58 (C ˜) | 40,61 | \<letter\>, Tilde |
| orange Fun 73 + 58 (C ˜) | 70(SPACE) | Tilde |
| orange Fun 73 + 58 (C ˜) | All others | Tilde followed by the letter (two separate characters) |
| orange Fun 73 + 42(S ˆ) | 34,37,38,39,40,44 | \<letter\>, Caret |
| orange Fun 73 + 42(S ˆ) | 70(SPACE) | Caret |
| orange Fun 73 + 42(S ˆ) | All others | Caret followed by the letter (two separate characters) |

Table 3 details the result of all key combinations present in the best mode. The first column lists the state of the device as unshifted, shifted, Fun (orange) or Fun (blue). The second column is the key number from FIG. 1 or FIG. 2. The third column is the description and the fourth a symbolic name and the last column is the hexadecimal character code value returned by the Windows WM_CHAR message for each key if applicable.

TABLE 3

| State | Key | Description | Symbolic Name | Code |
| --- | --- | --- | --- | --- |
| Unshifted | 4 | Power button | VK_OFF | |
| Shifted | 4 | Power button | VK_OFF | |
| Fun (blue) | 4 | Power button | VK_OFF | |
| Fun (orange) | 4 | Power button | VK_OFF | |
| Unshifted | 54 | BACKSPACE | VK_BACK | 8 |
| Shifted | 54 | BACKSPACE | VK_BACK | 8 |
| Fun (blue) | 54 | DEL | VK_DELETE | 2E |
| Fun (orange) | 54 | DEL | VK_DELETE | 2E |
| Unshifted | 43 | TAB/LTRIG | VK_TAB | 9 |
| Shifted | 43 | TAB/LTRIG | VK_TAB | 9 |
| Fun (blue) | 43 | TAB/LTRIG | VK_TAB | 9 |
| Fun (orange) | 43 | TAB/LTRIG | VK_TAB | 9 |
| Unshifted | 66 | ENT/SEL | VK_RETURN | 0D |
| Shifted | 66 | ENT/SEL | VK_RETURN | 0D |
| Fun (blue) | 66 | ENT/SEL | VK_RETURN | 0D |
| Fun (orange) | 66 | ENT/SEL | VK_RETURN | 0D |
| Unshifted | 69 | SHIFT | VK_SHIFT | 10 |
| Shifted | 69 | SHIFT | VK_SHIFT | 10 |
| Fun (blue) | 69 | NUM LOCK | VK_NUMLOCK | 90 |
| Fun (orange) | 69 | CAPS LOCK | VK_CAPITAL | 14 |
| Unshifted | 68 | CTRL | VK_CONTROL | 11 |
| Shifted | 68 | CTRL | VK_CONTROL | 11 |
| Fun (blue) | 68 | CTRL | VK_CONTROL | 11 |
| Fun (orange) | 68 | CTRL | VK_CONTROL | 11 |
| Unshifted | 55 | ALT | VK_MENU | 12 |
| Shifted | 55 | ALT | VK_MENU | 12 |
| Fun (blue) | 55 | ALT | VK_MENU | 12 |

TABLE 3-continued

| State | Key | Description | Symbolic Name | Code |
|---|---|---|---|---|
| Fun (orange) | 55 | ALT | VK_MENU | 12 |
| Unshifted | 31 | ESC/BACK | VK_ESCAPE | 1B |
| Shifted | 31 | ESC/BACK | VK_ESCAPE | 1B |
| Fun (blue) | 31 | ESC/BACK | VK_ESCAPE | 1B |
| Fun (orange) | 31 | ESC/BACK | VK_ESCAPE | 1B |
| Unshifted | 70 | SPACE | VK_SPACE | 20 |
| Shifted | 70 | SPACE | VK_SPACE | 20 |
| Fun (blue) | 70 | SPACE | VK_SPACE | 20 |
| Fun (orange) | 70 | SPACE | VK_SPACE | 20 |
| Unshifted | 44 | a | VK_A | 41 |
| Shifted | 44 | A | S + VK_A | |
| Fun (blue) | 44 | & | S + VK_7 | |
| Fun (orange) | 44 | " | S + VK_APOSTROPHE | " |
| Unshifted | 60 | b | VK_B | 42 |
| Shifted | 60 | B | S + VK_B | |
| Fun (blue) | 60 | ] | VK_RBRACKET | DD |
| Fun (orange) | 60 | ' | VK_APOSTROPHE | DE |
| Unshifted | 58 | c | VK_C | 43 |
| Shifted | 58 | C | S + VK_C | |
| Fun (blue) | 58 | > | S + VK_PERIOD | |
| Fun (orange) | 58 | ` | S + VK_BACKQUOTE | |
| Unshifted | 46 | d | VK_D | 44 |
| Shifted | 46 | D | S + VK_D | |
| Fun (blue) | 46 | ) | S + VK_0 | |
| Fun (orange) | 46 | | | |
| Unshifted | 34 | e | VK_E | 45 |
| Shifted | 34 | E | S + VK_E | |
| Fun (blue) | 34 | ⓤ | | 80 |
| Fun (orange) | 34 | € | | |
| Unshifted | 47 | f | VK_F | 46 |
| Shifted | 47 | F | S + VK_F | |
| Fun (blue) | 47 | { | S + VK_LBRACKET | |
| Fun (orange) | 47 | | | |
| Unshifted | 48 | g | VK_G | 47 |
| Shifted | 48 | G | S + VK_G | |
| Fun (blue) | 48 | } | S + VK_RBRACKET | |
| Fun (orange) | 48 | | | |
| Unshifted | 49 | h | VK_H | 48 |
| Shifted | 49 | H | S + VK_H | |
| Fun (blue) | 49 | - | VK_HYPHEN | BD |
| Fun (orange) | 49 | | | |
| Unshifted | 39 | i | VK_I | 49 |
| Shifted | 39 | I | S + VK_I | |
| Fun (blue) | 39 | 1 | VK_1 | 31 |
| Fun (orange) | 39 | | | |
| Unshifted | 50 | j | VK_J | 4A |
| Shifted | 50 | J | S + VK_J | |
| Fun (blue) | 50 | + | S + VK_EQUAL | |
| Fun (orange) | 50 | | | |
| Unshifted | 51 | k | VK_K | 4B |
| Shifted | 51 | K | S + VK_K | |
| Fun (blue) | 51 | 4 | VK_4 | 34 |
| Fun (orange) | 51 | | | |
| Unshifted | 52 | l | VK_L | 4C |
| Shifted | 52 | L | S + VK_L | |
| Fun (blue) | 52 | 5 | VK_5 | 35 |
| Fun (orange) | 52 | | | |
| Unshifted | 62 | m | VK_M | 4D |
| Shifted | 62 | M | S + VK_M | |
| Fun (blue) | 62 | * | S + VK_ | 8 |
| Fun (orange) | 62 | | | |
| Unshifted | 61 | n | VK_N | 4E |
| Shifted | 61 | N | S + VK_N | |
| Fun (blue) | 61 | / | VK_SLASH | BF |
| Fun (orange) | 61 | | | |
| Unshifted | 40 | o | VK_O | 4F |
| Shifted | 40 | O | S + VK_O | |
| Fun (blue) | 40 | 2 | VK_2 | 32 |
| Fun (orange) | 40 | | | |
| Unshifted | 41 | p | VK_P | 50 |
| Shifted | 41 | P | S + VK_P | |
| Fun (blue) | 41 | 3 | VK_3 | 33 |
| Fun (orange) | 41 | | | |
| Unshifted | 32 | q | VK_Q | 51 |
| Shifted | 32 | Q | S + VK_Q | |
| Fun (blue) | 32 | @ | S + VK_2 | |
| Fun (orange) | 32 | | | |
| Unshifted | 35 | r | VK_R | 52 |
| Shifted | 35 | R | S + VK_R | |
| Fun (blue) | 35 | $ | S + VK_4 | |
| Fun (orange) | 35 | ® | | A9 |
| Unshifted | 45 | s | VK_S | 53 |
| Shifted | 45 | S | S + VK_S | |
| Fun (blue) | 45 | ( | S + VK_9 | |
| Fun (orange) | 45 | | S + VK_6 | |
| Unshifted | 36 | t | VK_T | 54 |
| Shifted | 36 | T | S + VK_T | |
| Fun (blue) | 36 | % | S + VK_5 | |
| Fun (orange) | 36 | | | |
| Unshifted | 38 | u | VK_U | 55 |
| Shifted | 38 | U | S + VK_U | |
| Fun (blue) | 38 | = | VK_EQUAL | BB |
| Fun (orange) | 38 | | | |
| Unshifted | 59 | v | VK_V | 56 |
| Shifted | 59 | V | S + VK_V | |
| Fun (blue) | 59 | [ | VK_LBRACKET | DB |
| Fun (orange) | 59 | ` | VK_BACKQUOTE | C0 |
| Unshifted | 33 | w | VK_W | 57 |
| Shifted | 33 | W | S + VK_W | |
| Fun (blue) | 33 | £ | | 9C |
| Fun (orange) | 33 | æ | | 91 |
| Unshifted | 57 | x | VK_X | 58 |
| Shifted | 57 | X | S + VK_X | |
| Fun (blue) | 57 | < | S + VK_COMMA | |
| Fun (orange) | 57 | : | S + VK_SEMICOLON | |
| Unshifted | 59 | y | VK_Y | 59 |
| Shifted | 59 | Y | S + VK_Y | |
| Fun (blue) | 59 | # | S + VK_3 | |
| Fun (orange) | 59 | © | | B8 |
| Unshifted | 56 | z | VK_Z | 5A |
| Shifted | 56 | Z | S + VK_Z | |
| Fun (blue) | 56 | \ | VK_BACKSLASH | DC |
| Fun (orange) | 56 | | | S + VK_BACKSLASH | |
| Unshifted | 53 | ; | VK_SEMICOLON | BA |
| Shifted | 53 | ; | | |
| Fun (blue) | 53 | 6 | VK_6 | 36 |
| Fun (orange) | 53 | | | |
| Unshifted | 63 | , | VK_COMMA | BC |
| Shifted | 63 | , | | |
| Fun (blue) | 63 | 7 | VK_7 | |
| Fun (orange) | 63 | | | |
| Unshifted | 42 | _ | S + VK_HYPHEN | |
| Shifted | 42 | _ | | |
| Fun (blue) | 42 | - | VK_DECIMAL | 6E |
| Fun (orange) | 42 | | | |
| Unshifted | 64 | . | VK_PERIOD | BE |
| Shifted | 64 | . | | |
| Fun (blue) | 64 | 8 | VK_8 | 38 |
| Fun (orange) | 64 | | | |
| Unshifted | 65 | ? | S + VK_SLASH | |
| Shifted | 65 | ? | | |
| Fun (blue) | 65 | 9 | VK_9 | 39 |
| Fun (orange) | 65 | | | |
| Unshifted | 72 | ! | S + VK_1 | |
| Shifted | 72 | ! | | |
| Fun (blue) | 72 | 0 | VK_0 | 30 |
| Fun (orange) | 72 | | | |
| Unshifted | 11 | LEFT ARROW | VK_LEFT | 25 |
| Shifted | 11 | LEFT ARROW | | |
| Fun (blue) | 11 | PAGE UP | VK_PRIOR | 21 |
| Fun (orange) | 11 | | | |
| Unshifted | 12 | UP ARROW | VK_UP | 26 |
| Shifted | 12 | UP ARROW | | |
| Fun (blue) | 12 | PAGE DOWN | VK_NEXT | 22 |
| Fun (orange) | 12 | | | |
| Unshifted | 13 | RIGHT ARROW | VK_RIGHT | 27 |
| Shifted | 13 | RIGHT ARROW | | |
| Fun (blue) | 13 | END | VK_END | 23 |
| Fun (orange) | 13 | | | |
| Unshifted | 14 | DOWN ARROW | VK_DOWN | 28 |
| Shifted | 14 | DOWN ARROW | | |
| Fun (blue) | 14 | HOME | VK_HOME | 24 |
| Fun (orange) | 14 | | | |
| Unshifted | 73 | Fun(orange) | VK_RMENU | A5 |

TABLE 3-continued

| State | Key | Description | Symbolic Name | Code |
|---|---|---|---|---|
| Shifted | 73 | Fun(orange) | | |
| Fun (blue) | 73 | Fun(orange) | | |
| Fun (orange) | 73 | | | |
| Unshifted | 67 | Fun(blue) | | |
| Shifted | 67 | | | |
| Fun (blue) | 67 | | | |
| Fun (orange) | 67 | | | |
| Unshifted | 22 | TALK(SEND) | VK_F3 | 72 |
| Shifted | 22 | TALK(SEND) | | |
| Fun (blue) | 22 | TALK(SEND) | | |
| Fun (orange) | 22 | TALK(SEND) | | |
| Unshifted | 23 | END VK_F4 | | 73 |
| Shifted | 23 | END VK_F4 | | |
| Fun (blue) | 23 | END VK_F4 | | |
| Fun (orange) | 23 | VOLUME UP | | |
| Unshifted | 6 | VOLUME UP | VK_VOL_UP | |
| Shifted | 6 | VOLUME UP | VK_VOL_UP | |
| Fun (blue) | 6 | VOLUME UP | VK_VOL_UP | |
| Fun (orange) | 6 | VOLUME UP | VK_VOL_UP | |
| Unshifted | 7 | VOLUME DN | VK_VOL_DOWN | |
| Shifted | 7 | VOLUME DN | VK_VOL_DOWN | |
| Fun (blue) | 7 | VOLUME DN | VK_VOL_DOWN | |
| Fun (orange) | 7 | VOLUME DN | VK_VOL_DOWN | |
| Unshifted | 8 | ZOOM | VK_ZOOM | FB |
| Shifted | 8 | ZOOM | VK_ZOOM | FB |
| Fun (blue) | 8 | ZOOM | VK_ZOOM | FB |
| Fun (orange) | 8 | ZOOM | VK_ZOOM | FB |
| Unshifted | 21 | EMAIL | VK_APP_LAUNCH1 | |
| Shifted | 21 | EMAIL | VK_APP_LAUNCH1 | |
| Fun (blue) | 21 | EMAIL | VK_APP_LAUNCH1 | |
| Fun (orange) | 21 | EMAIL | VK_APP_LAUNCH1 | |
| Unshifted | 19 | BROWSER | VK_APP_LAUNCH2 | |
| Shifted | 19 | BROWSER | VK_APP_LAUNCH2 | |
| Fun (blue) | 19 | BROWSER | VK_APP_LAUNCH2 | |
| Fun (orange) | 19 | BROWSER | VK_APP_LAUNCH2 | |
| Unshifted | 18 | HOME | VK_APP_LAUNCH3 | |
| Shifted | 18 | HOME | VK_APP_LAUNCH3 | |
| Fun (blue) | 18 | HOME | VK_APP_LAUNCH3 | |
| Fun (orange) | 18 | HOME | VK_APP_LAUNCH3 | |

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more". The inventions illustratively disclosed herein may be practiced without any element which is not specifically disclosed herein.

What is claimed is:

1. A keyboard for use in a portable device comprising:
   a alphabetic keyboard with at least one key for each English letter arranged in a qwerty pattern for producing an output recognizable as letters,
   a numerical keyboard having at least ten keys arranged in a pattern identical to that of a standard telephone keypad with a first row including 1, 2, and 3 keys at the top and coincident with the right half of the top row of the alphabetic keyboard, a middle row including 4, 5, and 6 keys below the first row,
   and the second middle row including 7, 8, and 9 keys and an ultimate row below the second middle row including a 0 key, and
   a shifting means for shifting the function of keys between that of a alphabetic and numerical keyboards and keypads.

2. A keyboard for use in a portable device as in claim 1, further comprising means for generating international characters.

3. A keyboard for use in a portable device as in claim 1, wherein said international characters generated by said further comprising means include accents (, '), tildes (~), and carets (^).

4. A keyboard for use in a portable device as in claim 2, further comprising at least one specialized computer operating key.

5. A keyboard for use in a portable device as in claim 4, wherein said specialized computer operating keys include Ctrl, Alt, Del, Home, End, Esc and Tab keys.

6. A keyboard for use in a portable device as in claim 5, wherein said specialized computer operating keys include Right arrow, Left arrow, Up arrow and Down arrow keys.

* * * * *